United States Patent [19]

Whelan et al.

[11] 4,333,022
[45] Jun. 1, 1982

[54] SEMICONDUCTOR DEVICE FOR DIGITIZING AN ELECTRIC ANALOG SIGNAL

[75] Inventors: Maurice V. Whelan, Eindhoven; Claude J. P. F. Le Can, Nijmegen, both of Netherlands

[73] Assignee: U.S. Philips Corporation, New York, N.Y.

[21] Appl. No.: 71,225

[22] Filed: Aug. 30, 1979

Related U.S. Application Data

[63] Continuation of Ser. No. 909,348, May 25, 1978, abandoned, which is a continuation of Ser. No. 799,718, May 23, 1977, abandoned, which is a continuation of Ser. No. 575,212, May 7, 1975, abandoned.

[30] Foreign Application Priority Data

May 20, 1974 [NL] Netherlands .................. 7406728

[51] Int. Cl.³ .................. H03K 3/353; H03K 13/06; H01L 29/78; H01L 29/04
[52] U.S. Cl. .................. 307/304; 357/59; 340/347 AD; 307/501; 357/23; 357/24
[58] Field of Search .................. 357/23, 24, 59; 340/347 AD; 307/304, 501

[56] References Cited

U.S. PATENT DOCUMENTS

| | | | |
|---|---|---|---|
| 3,378,688 | 4/1968 | Kabell | 357/23 |
| 3,560,963 | 2/1971 | Trilling | 340/347 AD |
| 3,562,608 | 2/1971 | Gallagher et al. | 357/23 |
| 3,657,573 | 4/1972 | Maute | 357/22 |
| 3,657,614 | 4/1972 | Cricchi | 357/23 |
| 3,714,522 | 1/1973 | Kemiya et al. | 357/23 |
| 3,763,379 | 10/1973 | Ashikawa et al. | 357/23 |
| 3,775,623 | 11/1973 | Kamiyama et al. | 357/23 |
| 3,903,543 | 9/1975 | Smith | 357/24 |
| 3,930,255 | 12/1975 | Means | 357/24 |
| 3,992,639 | 11/1976 | Tansley | 357/23 |
| 3,993,991 | 11/1976 | Lorteije | 357/23 |

OTHER PUBLICATIONS

Putzrath "Solid-State Analog-to-Digital Converter" RCA Technical Note No. 465 (9/61), 2 pages.

*Primary Examiner*—Gene M. Munson
*Attorney, Agent, or Firm*—James J. Cannon, Jr.

[57] ABSTRACT

An analog/digital converter implemented on an MIS structure having a gate electrode in the form of a resistance layer across which the potential gradient is applied. The analog signal supplied to the gate electrode and is converted into a shift of an inversion layer below the gate electrode. The digital signal is obtained by means of determining the number of surface regions which are present below the gate electrode and which can be electrically connected to the inversion layer.

1 Claim, 14 Drawing Figures

SEMICONDUCTOR DEVICE FOR DIGITIZING AN ELECTRIC ANALOG SIGNAL

This is a continuation of application Ser. No. 909,348, filed May 25, 1978, now abandoned, which was a continuation of application Ser. No. 799,718, filed May 23, 1977, now abandoned, which was a continuation of application Ser. No. 575,212, filed May 7, 1975, now abandoned.

The invention relates to a semiconductor device for digitizing an analog electric input signal. Known semiconductor devices of this type which are often referred to by the English name of "analog-digital converter" (ADC) comprise, for example, a resistance network having taps at mutual distances, which can be connected to circuit elements, for example, transistors or diodes. These known devices usually show a very complex structure and can hence be comparatively expensive. In many applications, for example, in motorcar industry, there often exists the need of analog-digital converters which are cheaper than the known devices.

It is therefore one of the objects of the invention to provide an analog-digital converter which shows a less complex structure than known types, can be manufactured in a simple manner and can hence be comparatively cheap.

The invention is based inter alia on the recognition of the fact that an analog-digital converter can be obtained in a very simple manner by converting an analog input signal into a movement of an inversion layer obtained in the semiconductor body along a number of discrete regions which are present in the semiconductor body at a distance from each other.

A semiconductor device of the kind described in the preamble is therefore characterized according to the invention in that the semiconductor device comprises a semiconductor body having a surface-adjoining semiconductor region of one conductivity type in which a gate electrode insulated from the underlying semiconductor region by an insulating layer is present at the surface and an array of local surface regions present at a distance from each other are defined in the semiconductor region and are each present at least partly below the gate electrode, and in which means are present to form electric connections to the surface regions by means of an inversion layer having an extent which can be controlled in a direction substantially parallel to the array of surface regions, which extent can be modulated in the semiconductor region by means of the gate electrode, the input signal being supplied to the gate electrode as a result of which the extent of the inversion layer is controlled by the input signal, at least a surface zone of the second conductivity type which has an electric connection from which an electric output signal can be derived being present in the semiconductor region of the first conductivity type, the electric connection being at least temporarily connected conductively to at least one of the surface regions.

The inversion layer forms a kind of slide contact which, dependent on the input signal, can be moved along a number of surface regions and each time forms an electric connection with the surface regions.

As will become apparent hereinafter from the accompanying description of the figures, the semiconductor device according to the invention shows a particularly simple structure which occupies comparatively little semiconductor material, can be manufactured in a simple manner and by means of the generally known semiconductor technologies, and which generally can be cheaper than known semiconductor devices for digitizing an analog input signal.

In order to obtain an inversion layer having an extent which can be controlled in a direction parallel to the array of surface regions, various methods may be used either independently or in combination with each other. The inversion layer can be obtained, for example, by inverting the conductivity type of a thin surface layer below the gate electrode by means of ion implantation. Means may also be present, advantageously at or near the surface of the semiconductor region, by means of which a gradient in the threshold voltage is obtained below the gate electrode and in the longitudinal direction of the array. Such means may be formed, for example, by a non-uniform surface concentration in the semiconductor region or by an insulating layer having a non-uniform thickness and/or permittivity between the gate electrode and the surface of the semiconductor body.

A preferred embodiment (illustrated, for example, in FIG. 1) of the semiconductor device according to the invention is characterized in that the gate electrode comprises two connection contacts present near the ends of the array as a result of which a potential drop can be obtained across the gate electrode in a direction parallel to the array of surface regions. In this preferred embodiment, by applying the analog signals to the gate electrode, the parts of the gate electrode the potential of which is above and below, respectively, the further constant threshold voltage, is shifted so that a shift (extension or shrinkage) of the inversion layer below the gate electrode controlled by the input signal is also obtained.

It is to be noted that semiconductor devices having such a gate electrode are described in the non-prepublished U.S. patent application Ser. No. 422,543. The semiconductor devices described in said application, however, relate to radiation-sensitive devices in which the gate electrode serves for the successive reading of an array of photosensitive diodes by means of inversion channels which can be modulated by means of the gate electrode. In this case all the photosensitive zones are contacted successively by the induced inversion layer for reading the information stored in the zones in the form of electric charge. In a semiconductor device according to the invention, however, the input signal is supplied to the gate electrode in the form of an electric signal and is converted into a modulation of the extent or length of the inversion layer induced by the gate electrode.

A first type of semiconductor device according to the invention is characterized in that, by supplying the analog input signal to the gate electrode, electric connections are successively formed between the surface zone of the second conductivity type and a number of surface regions determined by the analog signal, an electric current flowing each time via the inversion layer between the surface regions and the surface zone and forms an electric output signal which is derived from the electric connection.

The surface regions may be formed by depletion regions which can be induced in the semiconductor region by means of an additional electrode system during or immediately preceding the inducing of the inversion layer. The electrode system may consist, for example, of a number of electrodes which are present at a distance from each other and which are present between the surface of the semiconductor body and the gate electrode and are insulated herefrom by intermediate insulating layers. During the formation of the electric connections to the depletion regions by means of the inversion layer, charge carriers of the second conductivity type can flow, via the inversion layer, from the surface zone of the second conductivity type into the depletion regions so that an electric current can be detected at the electric connection of said surface zone.

A preferred embodiment of the semiconductor device according to the invention which, inter alia, has the advantage that the manufacture thereof is very simple, is characterized in that the surface regions of the array are formed by surface zones of the second conductivity type and that means are present to electrically charge the surface zones of the array, the p-n junctions between the zones of the array and the semiconductor region of the first conductivity type being reversely biased.

By supplying an analog input signal to the gate electrode, electric connections can be formed to a number of zones determined by the input signal, in which zones can be discharged again. The connections by means of the shifting inversion layer can be formed successively, for example, by applying a sawtooth voltage at the gate electrode. A number of current or voltage pulses corresponding to the number of zones can be detected at the electric connection, in which pulses can then be supplied, for example, to a binary counter.

A further preferred embodiment is characterized in that, viewed on the surface, the zones of the array are present at least substantially entirely below the gate electrode and can be charged capacitively by means of the gate electrode. Therefore, no extra reverse p-n junctions are required in the preferred embodiment to charge the zones of the array. Since in addition the zones of the array are present entirely or at least substantially entirely below the gate electrode, a semiconductor device according to preferred embodiment may show a particularly simple and compact structure.

A second type of semiconductor device according to the invention (illustrated, for example in FIG. 6) is characterized in that a number of surface zones of the second conductivity type are present in the semiconductor region of the first conductivity type and are each present at least partly below the gate electrode, are each provided at least temporarily with an electric connection from which an electric output signal can be derived, and which also form the said surface regions of the array, a further zone of the second conductivity type which can be connected to the zones of the array by means of inversion layer being present in the semiconductor region of the first conductivity type. By means of a voltage source, the further zone can be connected to a reference potential which can be applied via the inversion layer to the zones of the array and may be considered as a logic "1" which can be distinguished from the second reference level which may be considered as a logic "0". Therefore, by finding out during operation which zone of the array and/or the electric connection connected to the zone shows a "1" (or a "0") state, information on the instantaneous extent of the inversion layer and hence on the value of the analog input signal can be obtained at that very instant.

A further preferred embodiment which inter alia has the advantage that, irrespective of the value of the analog input signal, only one single electric connection at a time shows a "1" while the remaining connections show the "0" state, and in which the "1" moves in the longitudinal direction of the array of zones with the analog input signal, is characterized in that a second gate electrode which is insulated from the semiconductor region by the insulating layer is present at the surface and belongs to the electric connections of the array of the surface zones and which, viewed on the surface, extends beside and substantially parallel to the first-mentioned gate electrode across the insulating layer and is present above a part of each of the zones of the array, in which a second array of surface zones of the second conductivity type extending substantially parallel to the first-mentioned array of zones is present in the semiconductor region of the one conductivity type, the zones each extending to below the second gate electrode and each forming part of the electric connection of one of the surface zones of the first array of zones, means being present to form electric connections between the zones of the first array and the associated zones of the second array by means of an inversion layer having an extent which can be controlled in a direction substantially parallel to the first and the second array of zones which can be induced in the semiconductor region by means of the second gate electrode and the direction of expansion of which is substantially opposite to that of the inversion layer below the first-mentioned gate electrode, the input signal being also supplied to the second gate electrode so that the extent of the inversion layer induced below the second gate electrode is also controlled by the input signal, channel stoppers being present between the zones of the second array as a result of which inversion of the conductivity type and hence electric connections between the zones of the second array can locally be prevented between said zones. The device can be adjusted, possibly by means of auxiliary voltage sources, in such manner that the inversion layers below the first and the second gate electrode, viewed in a direction from the second array of zones of the the further surface zone, overlap each other only over a distance of approximately the width of the zones or the distances between the zones of the first or the second array, as a result of which each time only a direct connection is possible between a zone of the second array via the inversion layer below the second gate electrode, the associated zone of the first array and via the inversion layer below the first gate electrode to the further surface zone of the second conductivity type applied to reference potential. The zones of the second array can be connected conductively to the input lines of, for example, a read-only memory in which the output signal is processed to a binary digit, each time only one input line being addressed at a time.

The gate electrode will preferably be manufactured from a suitable resistance material so as to restrict the energy dissipation as a result of the applied potential drop across the gate electrode to an acceptably low level. The voltage difference between the ends of the gate electrodes will be determined inter alia by the overall length of the gate electrode which is associated with the number of zones and the desired accuracy of the device correlated hereto, the size of and the mutual distance between the zones.

A further preferred embodiment of the semiconductor device according to the invention which inter alia has the advantage that at a given maximum voltage difference between the ends of the gate electrode a favorable potential distribution can be obtained across the gate electrode is characterized in that the parts of the gate electrode present above the surface regions of the array show a comparatively low resistance and the parts of the gate electrode present between the surface regions show a comparatively high resistance. In this preferred embodiment a comparatively large potential drop can be obtained across those parts of the gate electrode which, viewed on the surface, are present between the surface regions, while the potential drop across the parts of the gate electrode which are present above the surface regions can be only comparatively small. This may be of advantage in particular when a large discriminating power is required and/or when, for example, the mutual distances between the surface regions are only small.

The gate electrode can advantageously be formed by a layer of silicon provided on the insulating layer. Such a layer can be provided, for example, in the form of a high-ohmic and usually polycrystalline layer which, in order to obtain the low-ohmic parts above the surface regions, may locally be provided with regions having a high doping concentration.

The invention will now be described in greater detail with reference to a few embodiments and the accompanying diagrammatic drawing, in which FIG. 1 is a plan view of a part of a semiconductor device according to the invention;

It is to be noted that the Figures are diagrammatic only and are not drawn to scale.

Figure 1:
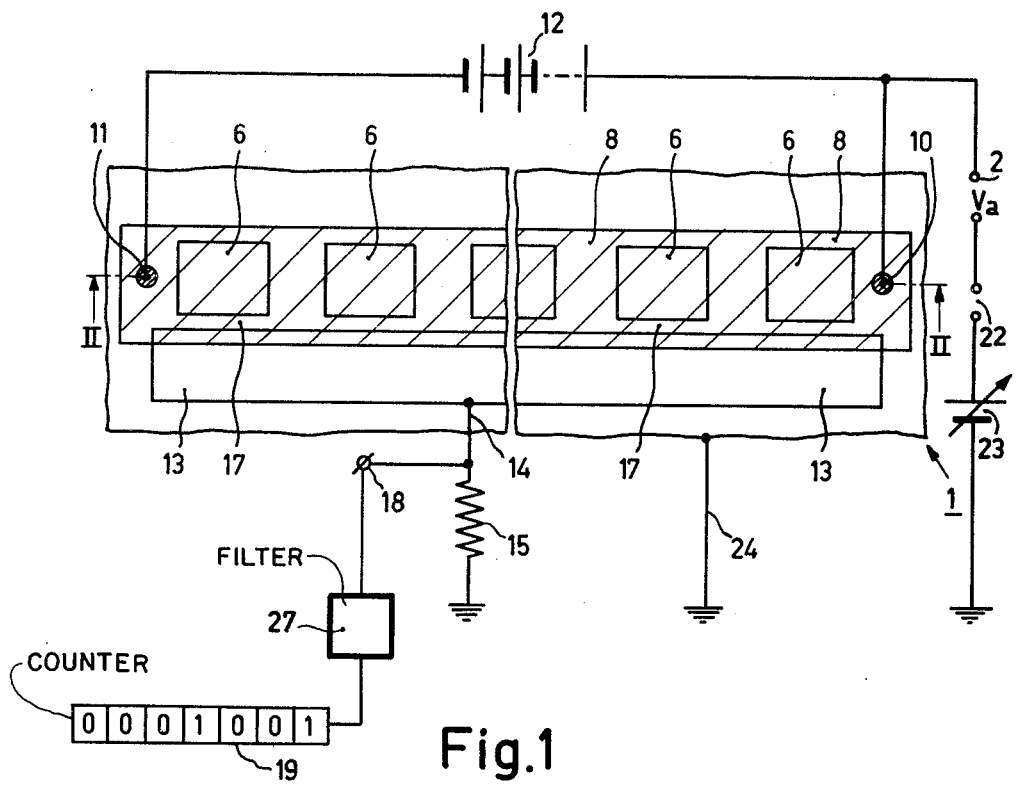
Figure 2:
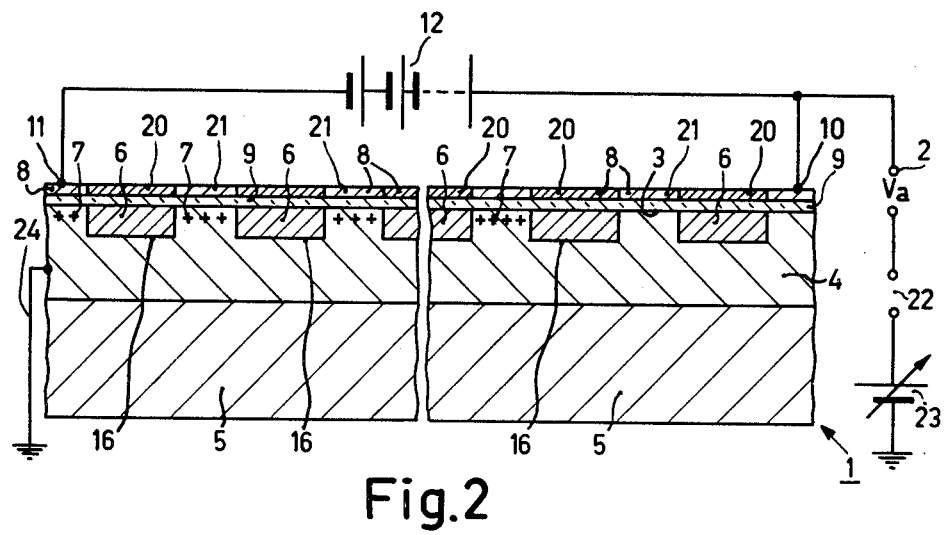
FIG. 2 is a cross-sectional view of the said semiconductor device taken on the line II—II of FIG. 1.

FIG. 1 is a plan view and FIG. 2 is a cross-sectional view taken on the line II—II of FIG. 1 of a part of a semiconductor device according to the invention destined to digitize an analog input signal $V_a$ which is supplied by an input source or signal source 2.

The semiconductor device, also termed analog-digital converter, comprises a semiconductor body 1 of silicon having an n-type semiconductor region 4 adjoining the surface. The whole body 1 may belong to the semiconductor region 4. However, the region 4 may also be only a sub-region of the body 1 and be provided, for example, in the form of an n-type epitaxial layer on a substrate 5 of p-type silicon.

An elongate strip-shaped gate electrode 8 is present at the surface 3 and is insulated from the underlying semiconductor region 4 by an intermediate insulating layer 9. The layer 9 which is not shown in FIG. 1 for clarity is formed by a layer of silicon oxide but may, of course, also consist of other materials or of several component layers of different materials.

An array of local surface regions 6 which are situated at a distance from each other are defined in the n-type semiconductor region and are each present at least partly below the gate electrode 8 and in the present embodiment are present entirely below the gate electrode.

In addition, means are present to form electric connections to the said surface regions 6 by means of an inversion layer which in FIG. 2 is denoted by crosses 7 representing holes. The means include inter alia the voltage source 12 to which will be referred hereinafter.

The inversion layer 7 which in the present embodiment can be obtained in the semiconductor region 4 by induction by means of the insulated gate electrode 8 shows a controllable extent in a direction parallel to the array of surface regions 6. In the present embodiment this means that the length of the inversion layer 7, viewed from the left-hand end of the figure to the right-hand end, is controllable by means of the gate electrode 8. The input signal $V_a$ which is supplied by the source 2 is supplied to the gate electrode 8 via the contact 10 so that the extent of the inversion layer 7 is controlled by the input signal $V_a$.

A p-type surface zone 13 which has an electric connection 14 is present in the n-type semiconductor region 4. The output signal can be derived from the connection 14 which is conductively connected, at least temporarily, to at least one of the surface regions 6.

In order to obtain an inversion layer 7 having a controllable extent, for example, an insulating layer may be used having a gradient in the thickness and/or a gradient in the permittivity, or a gradient in the doping concentration in the semiconductor region as a result of which a gradient in the threshold voltage is obtained. In the present embodiment however, the gate electrode 8 comprises two connection contacts 10 and 11 present adjacent the ends of the array of surface regions 6, as a result of which a potential drop can be obtained across the gate electrode 8 in a direction parallel to the array of surface regions 6, in behalf of which the connection contacts 10 and 11 are connected to the positive and negative terminals, respectively, of the voltage source 12.

As is shown in addition in FIGS. 1 and 2 the connection contact 10 is connected to a voltage source 22 which supplies a sawtooth-like voltage. As a result of this, during the supply of the analog input signal to the gate electrode 8, electric connections can successively be formed between the p-type surface zone 13 and a number of surface regions 6 determined by the analog signal $V_a$. A current consisting of holes can each time flow from a p-type zone 13 via the p-type inversion layer into the surface regions, which current forms an electric output signal which can be derived from the electric connection 14 of the p-type zone 13.

The surface regions 6 which may also be induced depletion regions, are formed in this case by p-type semiconductor zones 6 which form p-n junctions 16 with the n-type semiconductor region 4. The device comprises means to electrically charge the zones 6, the p-n junctions 16 being reversely biased.

The means include inter alia the gate electrode 8 which, as already noted, is present entirely above the p-type zones 6 as a result of which the zones 6 can be charged capacitively by means of the gate electrode 8. The zones 6 may then be connected conductively again to the p-type surface zone 13 via the inversion layer 7 and be discharged so that a discharge current flows through the resistor 15 which can be detected as a voltage pulse at the terminal 18 and be conveyed, for example, to a binary counter 19.

In the example described the gate electrode 8 is formed by a layer of polycrystalline silicon provided on the oxide layer 9. As shown in FIG. 2, the parts 20 of the gate electrode present above the zones 6 show a comparatively low resistivity, whereas the parts 21 present between the parts 20 show a comparatively high resistivity. Said high-ohmic parts which are present above the surface parts of the semiconductor region 4 in which the inversion layer 7 is induced enable a favorable distribution of the potential drop across the gate electrode.

Figure 5:
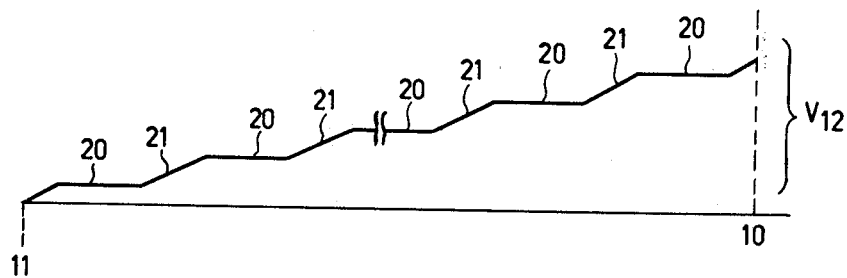
FIG. 5 shows the variation of the potential across the gate electrode in the semiconductor device.

FIG. 5 shows the potential drop across the gate electrode 8 from the connection contact 11 at the left-hand end of the gate electrode to the connection contact 10 at the right-hand end, the potential difference between the connection contacts 10 and 11 which is supplied by the voltage source 12 being denoted by $V_{12}$. The voltage gradients occur mainly at the area of the high-ohmic parts 21 and may hence be larger, with $V_{12}$ remaining the same, than when the whole gate electrode 8 would show a uniform resistivity.

It is to be noted that the low-ohmic parts 20 and the high-ohmic parts 21 of the gate electrode 8—as well as the oxide layer 9—are not shows in FIG. 1 for reasons of clarity.

Above the p-zones 6 the gate electrode 8 is doped with an impurity so as to obtain the parts 20 having a comparatively low resistivity. The highly doped, low-ohmic parts 20 of the polycrystalline silicon layer are separated from each other by the high-ohmic parts 21 which may be formed by the original low-doped polycrystalline semiconductor material.

For the manufacture of the semiconductor device described, the generally known semiconductor technologies can be used. The thickness and the resistivity of the p-type substrate 5 are not critical and are approximately 250 $\mu$m and 0.5–5 ohm.cm, respectively, while the thickness and the resistivity of the n-type epitaxial silicon layer (which are not critical either) are approximately 5 $\mu$m and 1–5 ohm.cm.

The p-type surface zones 6 of the array are approximately 20 $\mu$m by 15 $\mu$m and are provided at mutual distances of approximately 15 $\mu$m.

The insulating layer 9 of silicon oxide has a thickness of approximately 0.2 $\mu$m. The gate electrode 8 is formed by a p-type polycrystalline layer of silicon in a thickness of approximately 0.2 $\mu$m.

The value of the potential drop across the gate electrode 15 which is supplied by the voltage source 12 is determined inter alia by the mutual distances between the zones 6 and/or by the overall number of zones 6. It has been found that satisfactory results can be obtained by choosing $V_{12}$ to be so that at the area of the high-ohmic parts 21 of the gate electrode 8 the potential drop is approximately 50 Volt cm$^{-1}$.

Figure 3:
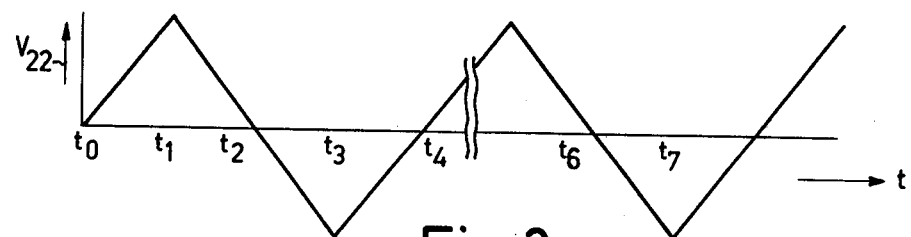
FIG. 3 shows the variation of the sawtooth-like voltage supplied by the voltage source used in said embodiment as a function of the time t.
Figure 4:
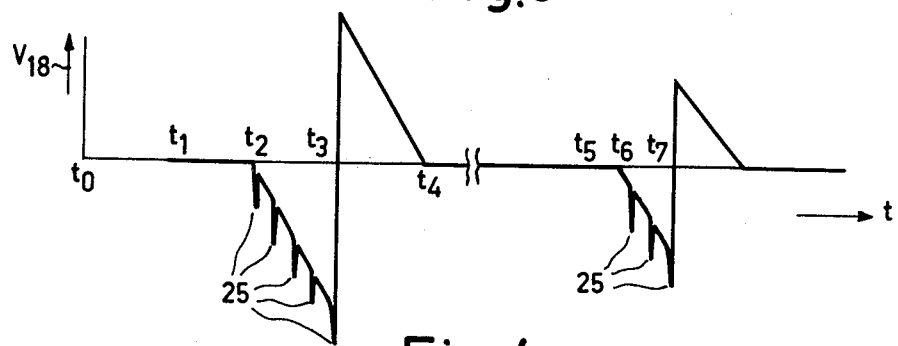
FIG. 4 shows the electric output signal of the said semiconductor device as a function of the time t.

The operation of the semiconductor device will now be described in greater detail also with reference to FIGS. 3 and 4. In FIG. 3 is plotted the variation of the voltage $V_{22}$ which is supplied by the sawtooth voltage source 22 as a function of the time t. FIG. 4 shows the potential $V_{18}$ at the output terminal 18 as a function of the time t.

As is shown diagrammatically in FIGS. 1 and 2, the sawtooth voltage source 22 is connected in series with the analog signal source 2. The gate electrode 8 may further be connected to the voltage source 23 by means of which the gate electrode 8 can be adjusted at a suitable direct voltage level. As is furthermore shown in FIGS. 1 and 2, the epitaxial layer 4 is connected to ground via the conductor 24 which is shown diagrammatically.

For convenience it is first assumed that the analog voltage $V_a$ supplied by the signal source 2 is equal to zero volt. The voltage source 23 can be adjusted so that when the voltage supplied by the sawtooth voltage source 22 is zero volt (for example, at the instant denoted by $t_o$ in FIG. 3), the potential of the gate electrode 8 at the area of the contact 11 is substantially equal to the threshold voltage.

When the voltage $V_{22}$ increases between $t_0$ and $t_1$ (FIG. 3), the potentials of the p-zones 6 will also increase as a result of the capacitive coupling between the gate electrode 8 and the p-zones 6. The p-n junctions 16 between the p-zones 6 and the grounded n-type region 4 are biased in the forward direction so that holes can be injected in the n-type region 4 from the p-zones 6 across the p-n junctions 16. The holes may recombine as minority charge carriers in the n-type region or, in the case in which the layer 4 is sufficiently thin, diffuse to the p-type substrate 5 and be drained there. In behalf of this, a negative bias voltage may be applied, if desired, to the substrate 5 so as to bias the p-n junction between the substrate 5 and the layer 4 in the reverse direction so that a good drain of injected holes from the n-layer 4 is possible.

At the instant denoted by $t_1$ in FIG. 3, the sawtooth voltage $V_{22}$ again decreases to zero Volt. As a result of the capacitive coupling between the gate electrode 8 and the p-type zones 6, the potential in the zones 6 will also decrease. The p-n junctions 16 between the p-zones 6 and the n-type layer 4 will be biased in the reverse direction so that the negative charge present in the zones 6 in the form of ionized acceptor ions cannot be neutralized.

At the instant $t_2$ (see FIG. 3) the sawtooth voltage $V_{12}$ decreases below zero Volt so that with the given adjustment of the voltage source 23 and with an analog signal voltage $V_a=0$ Volt, the inversion layer 7 is induced, in which holes which are shown in FIG. 2 by crosses are drawn to the surface 3 of the n-type layer 4 and form a thin p-type layer there in the n-region.

As a result of the applied voltage drop across the electrode 8 by means of the voltage source 12, the inversion layer 7 will first be formed near the contact 11 at the left hand-end of the gate electrode and then increase in length from the contact 11 in the direction of the contact 10 at the right-hand end of the gate electrode. The holes which are necessary for the growing inversion layer 7 are supplied from the p-type zone 13 as a result of which an electric current flows across the resistor 15 from ground to the zone 13. In so far as it is necessary for causing the inversion layer 7 to increase, the current will increase gradually between $t_2$ and $t_3$ as a result of the gradually decreasing voltage $V_{22}$, as a result of which the potential at the output terminal 18 will decrease gradually.

Simultaneously, the p-zones 6 which are charged electrically are connected to the p-type surface zone 13 by the inversion channels 7, in such manner that first the zone 6 present at the left-hand end of the row and near the contact 11 is connected to the zone 13, then the zone present beside that zone, and so on until finally the p-type zone 6 present at the right-hand end of the row near the contact 10 is connected to the zone 13. Each time when the inversion layer 7 reaches a p-type zone 6, the zone will be discharged at least for the greater part, a quantity of holes flowing in the zone and neutralizing the negative charge. The associated electric current manifests itself as a small voltage pulse at the output terminal 18. FIG. 4 shows a number of small voltage pulses between $t_2$ and $t_3$ which are denoted by reference numeral 25.

It is to be noted that only five of such pulses are shown in FIG. 4 for reasons of clarity; of course, however, so many voltage pulses can be detected as there are zones which are discharged in time intervals from $t_2$ to $t_3$.

At the instant $t_3$ the voltage $V_{22}$ increases again so that the induced inversion channels 7 are broken down. The voltage $V_{18}$ reverses sign and subsequently decreases gradually again to zero volt (earth potential) until a subsequent cycle begins at $t_4$.

The following method may be proceeded to convert an analog voltage signal $V_a$ into a digital signal, for example, a binary digit. The voltage source 23 is adjusted at such a voltage that at $V_a=0$ volt no inversion layer 7 is formed during the whole cycle of the sawtooth voltage $V_{22}$, but at the instant at which $V_{22}$ is minimum, the potential of the gate electrode at the area of the contact 11 at the left hand end is substantially equal to the threshold voltage. In this situation the zones 6 can be charged during the cycle of the sawtooth voltage $V_{22}$ but cannot be discharged.

In the case, however, in which an analog voltage signal $V_a$ is supplied to the gate electrode 8 by the voltage source 2, inversion at the surface 3 may occur again from an instant determined by the analog voltage $V_a$. An inversion layer 7 is induced again which expands from the contact 11 in the direction of the contact 10 over a distance which is given by the value of the analog signal, as a result of which the number of zones 6 which are successively connected to the zone 13 by the inversion layer 7 from the contact 11 in the direction of the contact 10 and are simultaneously discharged, is determined by the analog signal $V_a$.

By way of example, FIG. 4 also shows the output voltage $V_{18}$ in the case in which a—negative—analog voltage signal unequal to zero volt is applied to the gate electrode 8. At the instant denoted by $t_5$ the sawtooth voltage $V_{22}$ becomes smaller than zero volts as is shown in FIG. 3. However, as a result of the voltage $V_{23}$ which is supplied by the source 23, no inversion of the conductivity type occurs yet below the gate electrode 8. When the analog signal is equal to or substantially equal to zero volt, no inversion will occur during the whole sawtooth cycle. However, when the analog signal is unequal to zero volt, inversion can occur again below the gate electrode 8 from a given instant which is between $t_5$ and $t_7$. From this instant which is denoted by $t_6$ in FIG. 4, an electric current will flow again through the resistor 15 to build up the inversion layer 7. The number of zones 6 which are successively connected electrically by inversion layer 7, is determined by the analog signal $V_a$. In the case in which three zones are contacted from the connection contact 11, three voltage pulses can be detected after each other at the output terminal 18, as is shown in FIG. 4. The small voltage pulses can be supplied to a binary counter 19 via the filter 27 and be converted into a binary digit or be further processed in another manner. The filter 27 which is shown diagrammatically only may be a high frequency filter which passes only the pulses 25 formed by high frequency signals and retains the interference signals which occur as a result of the expansion or shrinkage of the inversion layer 7.

The sensitivity of the semiconductor device can be adjusted inter alia by means of the voltage drop across the gate electrode 8. In the embodiment described in which the voltage drop across the gate electrode 8 is approximately 50 Volts per cm at the area of the high-ohmic part 21 between the zones 6 and the distance between the zones is approximately 15 $\mu$m, the voltage pulses correspond to an increase of approximately 75 mV of the analog input signal $V_a$.

A second embodiment of a semiconductor device for digitizing an analog electric signal according to the invention will now be described with reference to FIGS. 6 and 7.

The device comprises a semiconductor body which may be of the same composition as the semiconductor body described in the preceding embodiment. Only the n-type surface region 31 of said semiconductor body is shown in FIGS. 6 and 7.

Present at the surface 30 is a gate electrode 47 in the form of a strip-shaped layer of polycrystalline silicon which is insulated from the semiconductor body by the insulating silicon oxide layer 35 and is hereinafter referred as the first gate electrode.

An array of p-type surface zones 50 is again defined in the n-type surface region. Electric connections to said zones can be formed again by means of an inversion layer 51 (see FIGS. 9 and 10) having an extent which is controllable in a direction substantially parallel to the array of zones 50. In behalf thereof, a voltage drop is applied across the gate electrode 47 by means of the voltage source 49, by means of which the inversion layer 51 can be induced in the semiconductor region 31, so that the inversion layer 51, viewed from the left-hand end of the gate electrode 47 can increase or decrease in length in the longitudinal direction of the array of zones 50.

The input signal $V_a$ is supplied to the gate electrode 47 so that the extent (length) of the inversion layer 51 is controlled by the input signal $V_a$.

Figure 6:
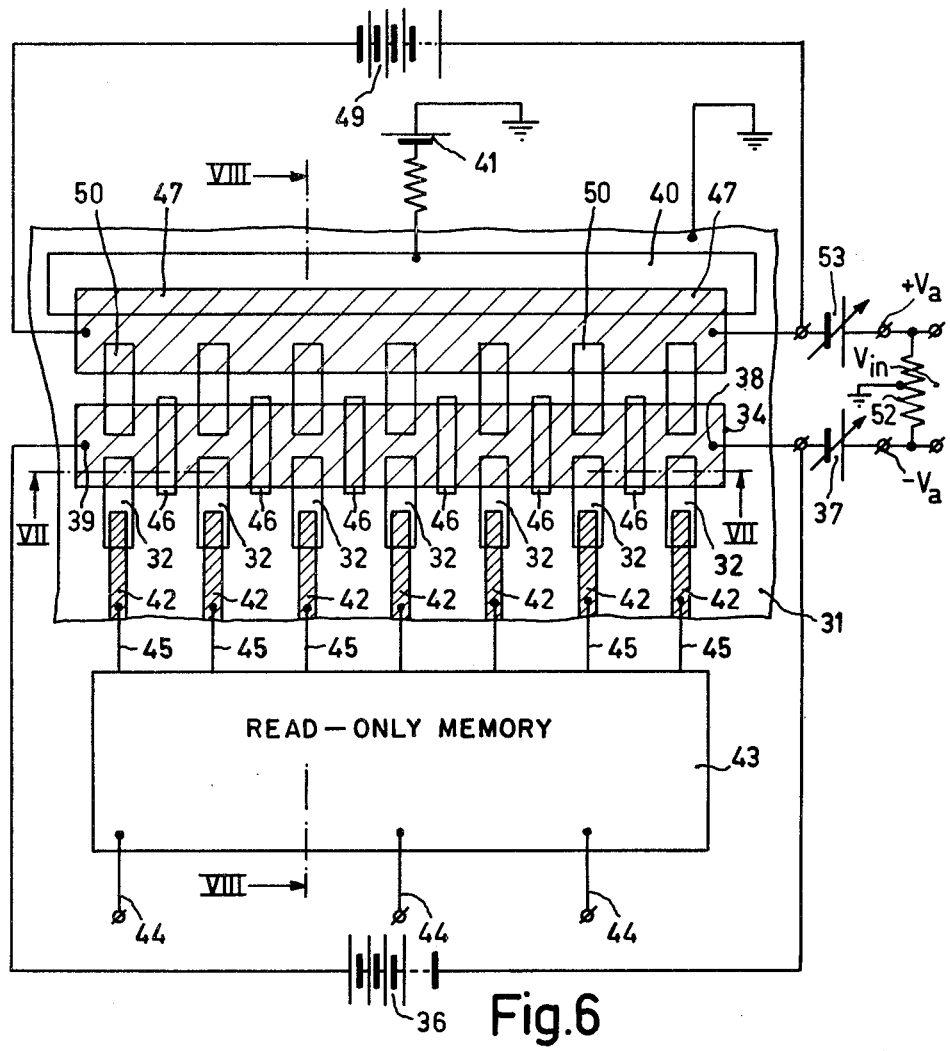
FIG. 6 is a plan view of a part of a second embodiment of the semiconductor device according to the invention.
Figure 7:
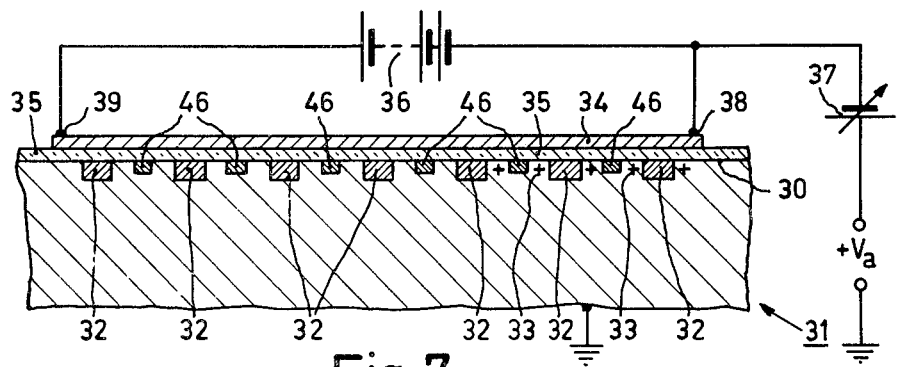
FIG. 7 is a cross-sectional view of the second embodiment taken on the line VII—VII of FIG. 6.
Figure 8:
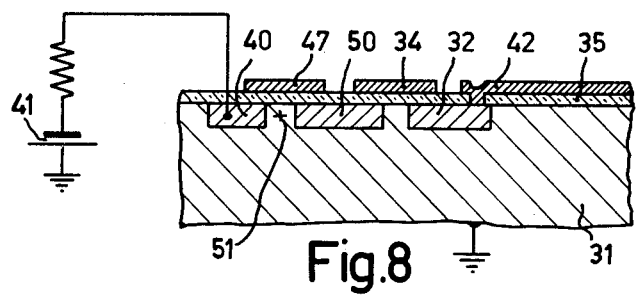
FIG. 8 is a cross-sectional view of the semiconductor device as shown in FIG. 6 taken on the line VIII—VIII in FIG. 6.

The zones 50 which, as is shown in FIG. 6 are present at least partly below the gate electrode 47 are provided at least temporarily with the electric connections from which an electric output signal can be derived and which will be described in detail hereinafter.

Present moreover in the semiconductor region 31 is a further p-type surface zone 40 which can be connected electrically to the zones 50 of the array by means of the invention layer 51.

As is shown inter alia in FIG. 6, a second gate electrode 34 insulated from the semiconductor region 31 by the insulating layer 35 is present at the surface 30 of the semiconductor body. The second gate electrode 34 which, like the first gate electrode 47, is provided in the form of a strip-shaped layer of polycrystalline silicon, belongs to the electric connection of the array of surface zones 50 and, viewed on the surface 30, extends beside and substantially parallel to the first gate electrode 47 across the insulating layer 35 and partly above the p-type surface zones 50.

Present in the n-type semiconductor region 31 is a second array of p-type surface zones 32 which, viewed on the surface 30, extend substantially parallel to the array of zones 50.

The p-type zones 32 each extend down to below the second gate electrode 34 and each form part of the electric connection of one of the p-type surface zones 50 of the first array of zones. For that purpose, means are present, including inter alia the voltage source 36, to form electric connections between the p-type zones 50 of the first array and the associated p-type zone 32 of the second array by means of an inversion layer 33 (see FIGS. 9 and 10).

The p-type inversion layer 33 which can be induced in the semiconductor region 31 by means of the gate electrode 34 shows an extent which can be controlled in a direction parallel to the first and/or the second array of p-type zones. The direction of expansion of the inversion layer 33 is opposite to the direction of expansion of the inversion layer 51 below the first gate electrode 47 by applying inter alia across the gate electrode a voltage gradient by means of the source 36 which is opposite to the voltage drop across the first gate electrode 47. In the present embodiment, the inversion layer 33 can increase in length from the right-hand end of the figure to the left.

In addition to the first gate electrode 47 the input signal $V_a$ (or $V_{in}$) is also supplied to the second gate electrode 34, as a result of which the extent of the inversion layer 33 induced below the second gate electrode 34 is also controlled by the analog input signal $V_a$.

Channel stoppers which in the present embodiment are formed by highly doped n-type zones 46 are provided between the p-type surface zones 32 so that inversion of the conductivity type and hence electric connections between the zones 32 of the array can locally be prevented between the p-type zones 32. As a result of this the p-type zones 32 can be connected electrically one by one, via the p-type inversion layer 33, the associated p-type zones 50, and the inversion layer 51, to the p-type surface zone 40 and hence to the voltage source 41.

As is furthermore shown in FIG. 6, the zones 32 have connection contacts 42 which can be connected electrically to the input lines 45 of, for example, a read-only memory or a read-out memory 43 which are shown diagrammatically only.

The electric connections between the input lines 45 of the memory 43 and the contacts 42 should of course not be restricted to ohmic connections but may be formed in a variety of manners and may each comprise, for example, an amplifier stage to amplify the signal to be supplied to the memory 43. Such an amplifier stage may comprise, for example, a flip-flop which is also integrated in the semiconductor body 31.

The read-out memory which is shown diagrammatically only in FIG. 6 by the block diagram 43, can convert the electric signals supplied via the zones 32 and the contacts 42 into a binary digit which can be derived from the output lines 44.

Figure 9:
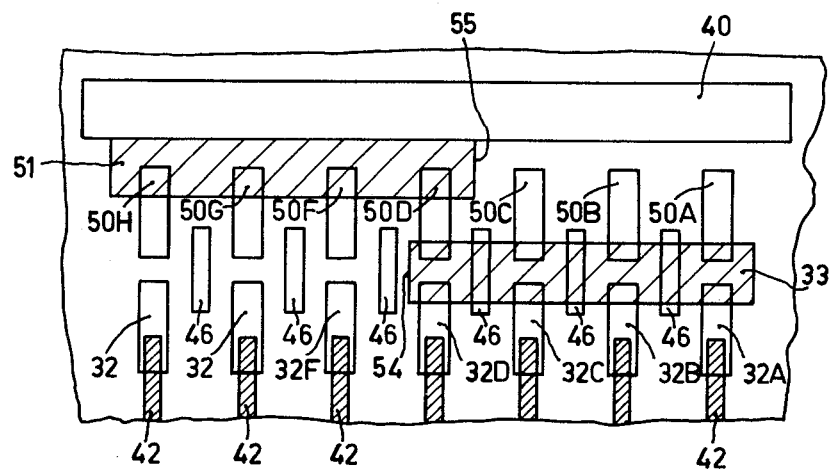
FIG. 9 and FIG. 10 are diagrammatic plan views of a part of the device shown in FIG. 6 during operation.
Figure 10:
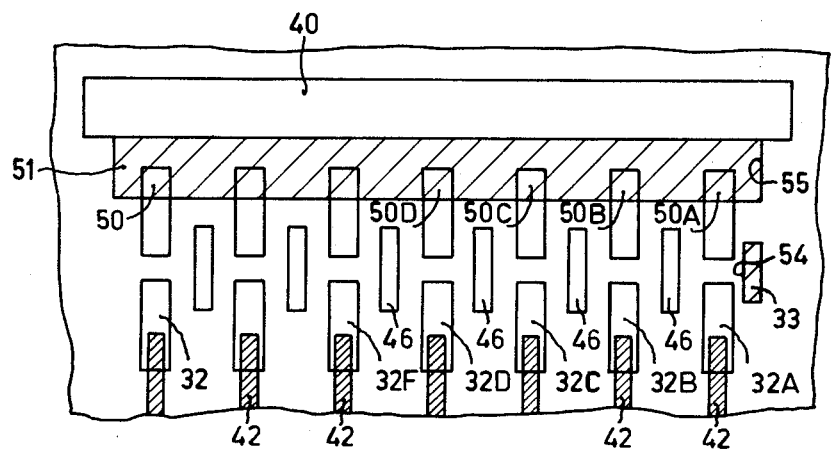

In order to explain the operation of the semiconductor device according to the present embodiment, FIGS. 9 and 10 are plan views of a part of the device, which part comprises the p-type zones 32, the channel stoppers 46, the p-type zones 50 and the p-type zones 40. The figures show in addition the inversion layers 33 and 51 for various values of the applied analog input signal. The gate electrodes 34 and 47 above the inversion layers 33 and 51 are not shown in these figures for clarity, nor is the insulating oxide layer 35.

It is assumed that the voltage gradient across the gate electrodes 34 and 47 which, as regards their direction, are substantially opposite to each other have substantially the same value.

The analog input signal $V_{in}$ which is supplied by the input source, may be a direct voltage signal which is applied via a potentiometer 52 (FIG. 6) the center of which is connected to ground and which is further connected electrically to the gate electrodes 34 and 47 via the voltage sources 37 and 53. As a result of this, an analog signal $V_a = \frac{1}{2}V_{in}$ is supplied to the gate electrode 47 and an analog signal $-V_a = -\frac{1}{2}V_{in}$ is supplied to the gate electrode 34. In the case in which $V_{in}$ is an alternating voltage, a transformer whose output terminals are connected to the gate electrodes 34 and 47 may be used instead of a potentiometer 51.

The voltage source 37 is adjusted so that with an input signal $V_{in}=0$ (or $V_a=0$) the potential of the gate electrode 34 at the area of the connection contact 38 is substantially equal to the threshold voltage so that in the semiconductor body below said gate electrode just on or at most an inversion layer 33 is induced near the connection contact 38 which, as shown in FIG. 10 forms no connection to the zones 32A, B, C and so on. It is to be noted that in FIGS. 9 and 10 the p-type zones 32 as well as the p-type zones 50 are denoted by 32A, 32B and so on, and by 50A, 50B, 50C, and so on for mutual distinction.

At the same time, the potential of the gate electrode 47 near the connection contact 48 is also adjusted at the threshold voltage by means of the voltage source 43 (see FIG. 6). As a result of the voltage drop which is applied across the gate electrode 47 by means of the voltage source 49, a p-type inversion layer 51 (see FIG. 10) is induced in the semiconductor body, extends below substantially the whole gate electrode 47 and connects all the zones 50 below the gate electrode to the p-type zones 40. Since the zones 32 are not connected electrically to the zones 50 by the inversion layer 33, none of the zones 32 is connected to the additional zones 40 so that none of the input lines 45 of the read-out memory can be addressed or selected either.

When an input signal is supplied via the potentiometer 52 in which the analog signal $-V_a$ is applied to the gate electrode 34 and the analog signal $+V_a$ is applied to the gate electrode 46, the extent or length of the conversion layer 51 below the gate electrode 47 will decrease so that the edge 55 of insulation layer 51 shifts to the left. As a result of this the zones 50A, 50B, 50C will no longer form electric connections to the p-type zones 50 (see FIG. 9) (dependent on the value of the supplied signal).

At the same time the inversion layer 33 below the gate electrode 34 will increase in length so that the edge 54 of the inversion layer 33 also moves to the left. It is to be noted that the inversion layer 33 is actually built up from a number of component layers which are separated from each other by the channel stoppers 46, so that the expression "increase or decrease in length" should be understood to include also a variation in length in an uninterrupted array of individual component inversion layers 33.

Since the gradients across the gate electrodes are substantially equal to each other, as well as the supplied analog signals, the edges 54 and 55 of the inversion layers 33 and 51, respectively, will move to the left over substantially equally large distances. FIG. 9 shows the situation in which the inversion layer 33 constitutes electric connections only between the p-type zones 32A, B, C and D on the one hand and the p-type zones 50A, B, C and D on the other hand. At the same time, electric connections are formed only between the p-type zones 50D, F, G and H of the zones shown on the one hand and the p-type zone 40 on the other hand by means of the inversion layer 51.

Consequently, of the zones 32 shown, the zones 32D in the situation shown in FIG. 9 is the only one of the zones 32 which is connected electrically to the p-type surface zone 40 and hence to the voltage source 41, as a result of which the input line 45 of the read-out memory 43 connected electrically to the zone 32D via the contact 42 is selected.

In this manner, the voltage supplied by the voltage source 41 can move along the zones 32 in accordance with the analog input signal $V_{in}$ ($V_a$), one of the input lines 45 of the read-out memory 44 being addressed. With an increasing input signal, the zones 32A, B, C, D and so on can successively be connected electrically to the source 41, so that an increasing binary digit can be read at the output.

The number of zones 32 and/or 50 and hence the number of input lines of the read-out memory 43 is determined inter alia by the required accuracy. An accuracy of approximately 1% with a given value of the input signal $V_{in}$ requires a binary output signal of 7 bits. This corresponds approximately to arrays of 128 zones 32 and 50, respectively. Such a device can still be manufactured simply by means of the known semiconductor technologies.

Figure 11:
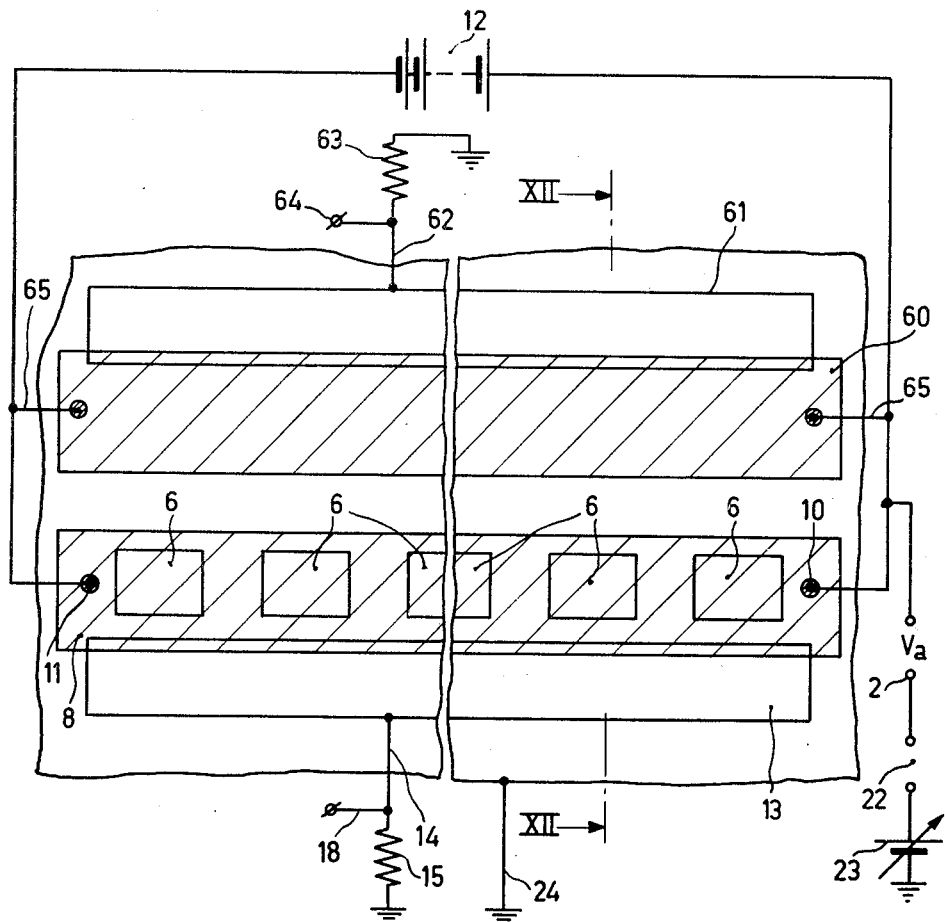
FIG. 11 is a plan view of a part of a third embodiment of a semiconductor body device according to the invention.
Figure 12:
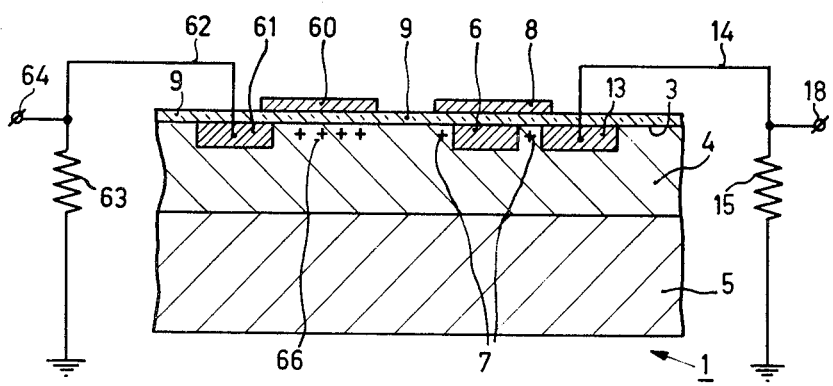
FIG. 12 is a cross-sectional view of the device shown in FIG. 11 taken on the line XII—XII of FIG. 11.

FIGS. 11 and 12 are a plan view and a cross-sectional view, respectively, of a part of a further embodiment of a semiconductor device according to the invention. The semiconductor device for which corresponding components have the same reference numerals as the semiconductor device according to the first described embodiments, constitutes a variation of the first embodiment and again comprises a gate electrode 8 which is insulated from the n-type semiconductor region 4 by the insulating oxide layer 9. Defined in the n-type region 4 is an array of surface regions 6 which are each formed by a p-type surface zone and which can be connected electrically to the p-type surface zone 13 by means of an inversion layer which shows a controllable extent. The zone 13 has a connection 14 which is connected to ground via the resistor 15. The connection 14 furthermore comprises an output terminal 18 for deriving an electric output signal.

In order to suppress electric interference signals which are introduced in the output signal as a result of the growth or decrease of the inversion layer, a further gate electrode 60 is provided on the insulating layer 9 which, as regards structure, is substantially identical to the gate electrode 8 above the p-zones 6.

Present in the semiconductor region 4 is a further p-type surface zone 61 which also has an electric connection 62 which is electrically connected to ground via a resistor the value of which is substantially the same as that of the resistor 15. The connection 62 furthermore has a connection terminal 64 from which electric signals can be derived.

As is shown in addition to FIG. 11, the right-hand end and the left-hand end, respectively, of the gate electrode 60 are conductively connected, via the diagrammatically shown conductors 65, to the right-hand end and the left-hand end, respectively, of the gate electrode 8. As a result of this a second inversion layer 66 will be induced in the semiconductor region 4 below the gate electrode 60 simultaneously with the p-type inversion layer 7 below the gate electrode 8. Viewed from the left-hand end of the gate electrode 60, the length of the inversion layer 66 will be modulated in a direction of the right-hand end of the gate electrode 60 in a manner substantially identical to that of the inversion layer 7 in accordance with the signal source 2 and/or the sawtooth voltage source 22. The electric currents through the resistors 15 and 63 associated with the modulation of the inversion layers 7 and 66 will therefore be substantially equal to each other.

Figure 13:
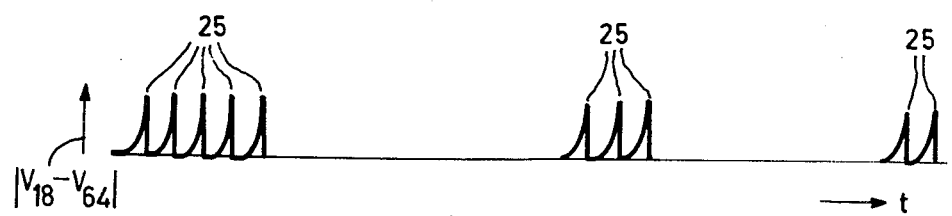
FIG. 13 shows an output signal as a function of the time t during operation of the device shown in FIG. 12.

In FIG. 13 the differential voltage $|V_{18}-V_{64}|$ is plotted as a function of time t. As shown in this figure the voltage difference between the output terminals 18 and 64 shows substantially only the voltage pulses 25 which are caused by the discharge of the p-type zones 6, while the interference signals as a result of the modulation of the inversion layer 7 are substantially entirely compensated for. The output signal $|V_{18}-V_{64}|$ can now be supplied directly, for example, to the binary counter 19, the filter 27 used in the first embodiment being superfluous.

Figure 14:
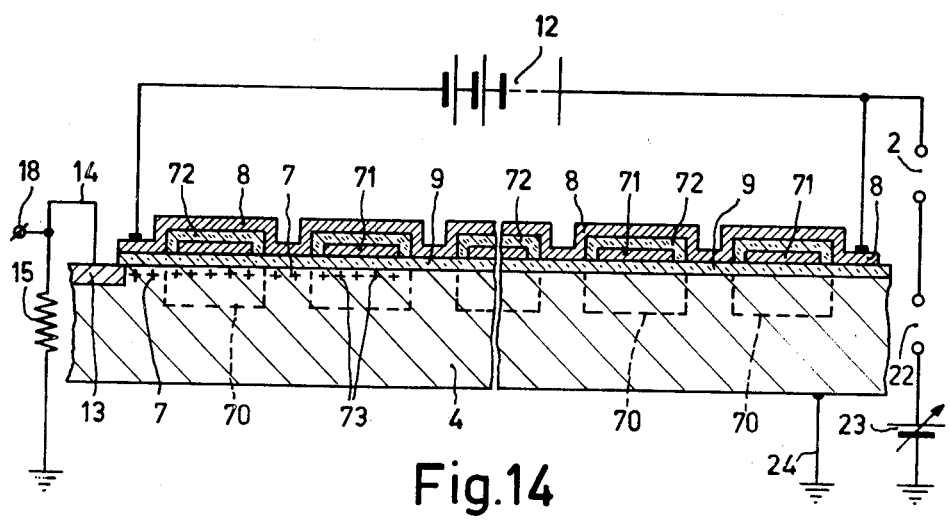
FIG. 14 shows a cross-sectional view of a variation of the invention according to the first embodiment.

FIG. 14 shows a further variation of the analog-digital converter described with reference to the first embodiment. The device according to the present embodiment differs in particular herein from the device according to the first embodiment that the surface regions along which the inversion layer 7 moves are not formed by p-type surface zones 6 but by induced regions 70. For that purpose, electrodes 71 are provided on the insulating oxide layer 9 and may be connected together conductively. By applying a negative voltage to the electrodes 71, the deep depletion regions 70 are formed which are denoted in broken lines. The induced regions 70 may then be connected successively to the p-type zone 13 by means of the p-type inversion layer 7 in the same manner as the p-type surface zones 6 in the first embodiment. The number of regions 70 which is connected to the zone 13 (and in which the inversion layers 73 are formed in the regions 70) and the number of voltage pulses which corresponds to the number and which can be derived from the output terminal 18, then again form a measure of the analog voltage signal which is supplied to the gate electrode 8 via the source 2.

It is to be noted that, viewed on the surface, the induced regions 70 and the electrodes 71—which are insulated from the gate electrode 8 by the insulating oxide layer 72—may extend mainly beside the gate electrode 8 and need not be present mainly below the gate electrode, as in the first embodiment the p-type zones 6 to be charged by means of the gate electrode 8. The regions 70 need extent below the gate electrode 8 only over such a distance that electric connections can be formed between the p-type zones 13 and the induced regions 70 by means of the inversion layers 7.

It will be obvious that the invention is not restricted to the examples described but that many variations are possible to those skilled in the art without departing from the scope of this invention.

For example the conductivity types in the embodiments described may be reversed, in which the polarities of the applied voltages or voltage differences should also be reversed.

Instead of the materials mentioned, other materials may also be used. For example, the gate electrode 8 in the first embodiment and/or the gate electrodes 34 and 37 in the second embodiment may also be manufactured from a suitable metal, for example, aluminum or lead oxide, instead of from polycrystalline silicon.

Instead of the highly doped zones 46 in the second embodiment, other channel stopping means for example, a local thickening of the insulating layer 35, may also be used.

Instead of the voltage source 22 in the first and third embodiment which supplies a triangular voltage, a voltage source may be used which, for example, supplies a true sawtooth voltage or a true alternating voltage. In these embodiments, the input source 2 and/or the sawtooth voltage source 22 may advantageously be connected electrically to the contact 11 at the left-hand end of the gate electrode 8 instead of to the contact 10 at the right-hand end of the gate electrode 8.

Furthermore, in addition to a strip-shaped and rectangular configuration, the gate electrode may also show different geometries. For example, in particular a comb-like configuration may advantageously be used for the gate electrode, with a base portion in the form of a resistance layer across which the voltage gradient can be applied, and with projecting parts or digits which may then consist of low-ohmic material and below which the surface regions to be connected are present.

In the embodiment shown in FIG. 6, the input lines 45 of the read-out memory 43 may furthermore be connected electrically to switching devices, for example, a switch, with which the lines 45 can temporarily be applied to a reference potential, for example ground, as a result of which the memory 43 can be erased or reset and/or as a result of which the appearance of undefined information at the outputs 44 can be avoided. Such a switching device may comprise, for example, a number of most-switches having individual source zones (or drain zones) which can each be contacted to an input line 45, and having a common gate electrode and a common drain zone (or source zone) which is connected to ground.

Furthermore, in the same embodiment the zones 50 are not necessary in all circumstances but they may be omitted in some cases, for example, when the gate electrodes 47 and 34 overlap each other partly.

What is claimed is:

1. A semiconductor circuit arrangement having an analog to digital converter, said circuit arrangement comprising:
   a body of semiconductive material including a semiconductive region of a first conductivity type adjoining the surface of said body;
   a first array of local surface regions of a second conductivity type disposed in said semiconductive region and spaced apart from each other;
   a first and a second surface zone of the second conductivity type in said semiconductive region, each provided with an electric connection;
   an insulating layer extending at least partially over said semiconductive region;
   a first gate electrode, having two ends, insulated from said semiconductive region and extending at least partially over said surface regions of said first array and said first surface zone of the second conductivity type;
   a second gate electrode, having two ends, having substantially the same width as the first gate electrode and insulated from said semiconductive region and extending partially over said second surface zone of the second conductivity type;
   one end and the other end of said first gate electrode being connected, respectively, to one end and the other end of said second gate electrode;
   means for forming an inversion layer in said semiconductive region under each of said gate electrodes;
   said inversion layers adjoining the surface of the body and having an extent which can be controlled in a direction substantially parallel to said gate electrodes;
   means for electrically charging said surface regions;
   input means for supplying an analog signal to be converted to a digital signal to said gate electrodes;
   said input analog signal causing a substantially uniform increase or decrease of the gate potential across the whole length of said gate electrodes and thereby a corresponding modulation of the inversion layers, the increases or decreases of the inversion layers under the gate electrodes being substantially equal to each other;
   the inversion layer under said first gate electrode electrically connecting each region of said array of surface regions in succession to said first surface zone and at least partly discharging each region of said array of surface regions by means of the introduction of majority charge carriers of these regions into these regions;
   said charge carriers being supplied via the first surface zone and causing an electric pulse on said electric connection of said first surface zone; and
   counter means connected to said first and said second surface zones via said electric connections for determining differentially an output signal between said electric connections and for counting the number of pulses in said output signal, said number being determined by the number of surface regions connected by the inversion layer under the first gate to the first surface zone and thereby by the magnitude of said analog input signal.

* * * * *